United States Patent
Nishimaki et al.

(10) Patent No.: US 11,650,505 B2
(45) Date of Patent: May 16, 2023

(54) RESIST UNDERLAYER FILM-FORMING COMPOSITION CONTAINING NOVOLAC RESIN REACTED WITH AROMATIC METHYLOL COMPOUND

(71) Applicant: NISSAN CHEMICAL INDUSTRIES, LTD., Tokyo (JP)

(72) Inventors: Hirokazu Nishimaki, Toyama (JP); Rikimaru Sakamoto, Toyama (JP); Keisuke Hashimoto, Toyama (JP); Takafumi Endo, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/502,600

(22) PCT Filed: Aug. 4, 2015

(86) PCT No.: PCT/JP2015/072081
§ 371 (c)(1),
(2) Date: Feb. 8, 2017

(87) PCT Pub. No.: WO2016/021594
PCT Pub. Date: Feb. 11, 2016

(65) Prior Publication Data
US 2017/0227850 A1 Aug. 10, 2017

(30) Foreign Application Priority Data
Aug. 8, 2014 (JP) .............................. JP2014-162367

(51) Int. Cl.
| | | |
|---|---|---|
| *G03F 7/11* | (2006.01) |
| *G03F 7/038* | (2006.01) |
| *G03F 7/039* | (2006.01) |
| *G03F 7/09* | (2006.01) |
| *G03F 7/16* | (2006.01) |
| *G03F 7/32* | (2006.01) |
| *G03F 7/20* | (2006.01) |
| *C08G 12/26* | (2006.01) |
| *C08G 14/06* | (2006.01) |
| *C09D 161/34* | (2006.01) |
| *H01L 21/308* | (2006.01) |
| *H01L 21/311* | (2006.01) |
| *G03F 7/38* | (2006.01) |

(52) U.S. Cl.
CPC .............. *G03F 7/11* (2013.01); *C08G 12/26* (2013.01); *C08G 14/06* (2013.01); *C09D 161/34* (2013.01); *G03F 7/038* (2013.01); *G03F 7/039* (2013.01); *G03F 7/094* (2013.01); *G03F 7/162* (2013.01); *G03F 7/168* (2013.01); *G03F 7/2004* (2013.01); *G03F 7/2006* (2013.01); *G03F 7/2037* (2013.01); *G03F 7/322* (2013.01); *G03F 7/325* (2013.01); *G03F 7/38* (2013.01); *H01L 21/3081* (2013.01); *H01L 21/3086* (2013.01); *H01L 21/31116* (2013.01); *H01L 21/31144* (2013.01)

(58) Field of Classification Search
CPC .......... G03F 7/11; G03F 7/09; H01L 21/3081; H01L 21/3086; H01L 21/31116; H01L 21/31144; C08G 12/26; C08G 14/06; C09D 161/34
See application file for complete search history.

(56) References Cited

U.S. PATENT DOCUMENTS 2,728,741 A * 12/1955 Simon ....................... C08G 8/04
521/121
2,754,335 A * 7/1956 Bender ................... C07C 37/20
528/219
(Continued)

FOREIGN PATENT DOCUMENTS

DE 281918 * 8/1990
JP 01-102457 * 4/1989
(Continued)

OTHER PUBLICATIONS

Machine translation of JP 2005-156816 (2005).*
Knop et al., "Phenolic resins: Chemistry, applications, and performance: future directions", Springer-Verlag GmbH, Chapter 3, reaction mechanisms, pp. 24-61 (1985).*
(Continued)

*Primary Examiner* — Martin J Angebranndt
(74) *Attorney, Agent, or Firm* — Oliff PLC

(57) ABSTRACT

A resist underlayer film for lithography has high solubility in a resist solvent (solvent used in lithography) for expressing good coating film forming property and a smaller selection ratio of dry etching rate as compared with a resist. A resist underlayer film-forming composition containing a novolac resin containing a structure (C) obtained by a reaction of an aromatic ring of an aromatic compound (A) with a hydroxy group-containing aromatic methylol compound (B). The aromatic compound (A) may be a component constituting the structure (C) in the novolac resin. The hydroxy group-containing aromatic methylol compound (B) may be a compound of Formula (1):

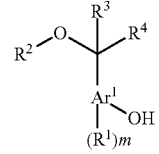

Formula (1)

The hydroxy group-containing aromatic methylol compound (B) may be 2-hydroxybenzyl alcohol, 4-hydroxybenzyl alcohol, or 2,6-di-tert-butyl-4-hydroxymethyl phenol.

15 Claims, No Drawings

(56) References Cited

U.S. PATENT DOCUMENTS

| | | | | |
|---|---|---|---|---|
| 4,939,229 | A | * | 7/1990 | Bogan, Jr. ............... C08G 8/08 522/146 |
| 5,510,420 | A | * | 4/1996 | Dammel ................. C08F 8/00 525/134 |
| 5,554,719 | A | * | 9/1996 | Sounik .................. C08G 61/02 528/212 |
| 5,565,544 | A | * | 10/1996 | Sounik .................. C08G 61/02 528/207 |
| 5,589,553 | A | * | 12/1996 | Zampini ................. G03F 7/023 525/504 |
| 7,378,217 | B2 | | 5/2008 | Oh et al. |
| 8,993,215 | B2 | * | 3/2015 | Nishimaki ............. G03F 7/168 430/270.1 |
| 9,263,286 | B2 | * | 2/2016 | Sakamoto ............ C09D 179/02 |
| 2008/0153031 | A1 | * | 6/2008 | Echigo ................. G03F 7/0382 430/281.1 |
| 2012/0077345 | A1 | * | 3/2012 | Saito ...................... C08G 12/26 438/703 |
| 2012/0184103 | A1 | * | 7/2012 | Ogihara ................. C08G 10/02 438/703 |
| 2013/0171569 | A1 | * | 7/2013 | Tachibana ............... G03F 7/004 430/287.1 |
| 2013/0200500 | A1 | * | 8/2013 | Nozaki .................... C08K 5/17 257/618 |
| 2013/0337649 | A1 | * | 12/2013 | Tachibana ............... G03F 7/094 438/694 |
| 2014/0023969 | A1 | * | 1/2014 | Imada .................. C09D 161/06 430/270.1 |
| 2014/0235059 | A1 | * | 8/2014 | Sakamoto ............. C08G 12/08 438/702 |
| 2015/0044876 | A1 | * | 2/2015 | Nishimaki ............. G03F 7/091 438/703 |
| 2015/0184018 | A1 | * | 7/2015 | Endo .................... C09D 161/04 438/703 |
| 2015/0362835 | A1 | * | 12/2015 | Ohnishi .............. H01L 21/0274 430/270.1 |
| 2016/0068709 | A1 | * | 3/2016 | Endo .................... C09D 161/12 438/703 |
| 2017/0097568 | A1 | * | 4/2017 | Endo .................... C09D 161/34 |

FOREIGN PATENT DOCUMENTS

| | | | |
|---|---|---|---|
| JP | H01-154050 | A | 6/1989 |
| JP | 01-289825 | * | 11/1989 |
| JP | H02-022657 | A | 1/1990 |
| JP | 02-282342 | * | 11/1990 |
| JP | H02-293850 | A | 12/1990 |
| JP | 05-204147 | * | 8/1993 |
| JP | 09-316016 | * | 12/1997 |
| JP | 2005-114921 | * | 4/2005 |
| JP | 2005-128509 | A | 5/2005 |
| JP | 2005-156816 | A | 6/2005 |
| JP | 2006259249 | A | 9/2006 |
| JP | 2007-178974 | A | 7/2007 |
| JP | 2007-199653 | A | 8/2007 |
| JP | 2013-156627 | A | 8/2013 |
| JP | 2014-024831 | A | 2/2014 |
| WO | 2010/147155 | A1 | 12/2010 |
| WO | 2013/047516 | A1 | 4/2013 |
| WO | 2013/146670 | A1 | 10/2013 |
| WO | 2014030579 | * | 2/2014 |

OTHER PUBLICATIONS

Machine translation of JP 05-204147 ( Aug. 1993 ).*
Machine translation of JP 01-102457 (Apr. 1989).*
Machine translation of JP 02-282342 ( Nov. 1990 ).*
Machine translation of JP 09-316016 (1997 ).*
Sep. 8, 2015 Written Opinion issued with International Patent Application No. PCT/JP2015/072081.
Sep. 8, 2015 International Search Report issued with International Patent Application No. PCT/JP2015/072081.
"The Chemical Society of Japan Kinki Shibu," Aug. 28, 2015.

* cited by examiner

RESIST UNDERLAYER FILM-FORMING COMPOSITION CONTAINING NOVOLAC RESIN REACTED WITH AROMATIC METHYLOL COMPOUND

TECHNICAL FIELD

The present invention relates to a resist underlayer film-forming composition for lithography effective in processing of a semiconductor substrate, a method for forming a resist pattern using the resist underlayer film-forming composition, and a method for producing a semiconductor device.

BACKGROUND ART

Conventionally, in production of a semiconductor device, microprocessing by lithography using a photoresist composition has been carried out. The microprocessing is a processing method in which a thin film of the photoresist composition is formed on a substrate to be processed such as a silicon wafer, irradiated with an active light such as an ultraviolet light through a mask pattern that has a pattern of the semiconductor device, and developed, and the substrate to be processed such as a silicon wafer is etched using the obtained photoresist pattern as a protective film. In recent years, an increase in degree of integration of semiconductor device has advanced, the wavelength of used active light has shortened by changing a KrF excimer laser (248 nm) into an ArF excimer laser (193 nm). For this reason, diffuse reflection of active light on a substrate and influences of standing wave are sever problems. A method for providing an anti-reflective coating (Bottom Anti-Reflective Coating, BARC) between the photoresist and the substrate to be processed has been widely applied. For further microprocessing, a lithography technique using an extreme ultraviolet light (EUV, 13.5 nm) or an electron beam (EB) as the active light has been also developed. In EUV lithography and EB lithography, since diffuse reflection on a substrate and standing wave do not generally occur, a specific anti-reflective coating is not required, but a resist underlayer film is widely investigated as an auxiliary film for improving the resolution property and adhesion of a resist pattern.

When miniaturization of the resist pattern advances, a decrease in film thickness of a resist is essential. This is because a decrease in resolution and collapse of resist pattern to be formed due to the miniaturization are likely to occur. For this reason, it is difficult that a resist pattern film thickness necessary for substrate processing is maintained. It is necessary that a function of a mask is imparted to not only the resist pattern but also a resist underlayer film that is formed between the resist and a semiconductor substrate to be processed during the substrate processing. For a decrease in film thickness of such a resist, a resist underlayer film of at least two layers is formed, and a lithography process using the resist underlayer films as an etching mask is used. For such a thin film resist, a process in which the resist pattern is transferred to an underlayer film thereof by an etching process, and a substrate is processed using the underlayer film as a mask, or a process in which the resist pattern is transferred to an underlayer film thereof by an etching process, and a step of transferring the pattern transferred to the underlayer film to another underlayer film thereof using a different etching gas is repeated, and a substrate is finally processed is used. The resist underlayer films for the lithography process are required to have high etching resistance to the etching gas (e.g., fluorocarbon) in a dry etching step.

Examples of a polymer for the resist underlayer film include as follows.

Resist underlayer film-forming compositions using polymethylol carbazole are disclosed (see Patent Documents 1, 2, and 3).

Resist underlayer film-forming compositions using fluorene phenol novolac resin are disclosed (see Patent Document 4).

Resist underlayer film-forming compositions using fluorene naphthol novolac resin are disclosed (see Patent Document 5).

Resist underlayer film-forming compositions containing a resin having fluorene phenol and arylalkylene as repeating units are disclosed (see Patent Documents 6 and 7).

Resist underlayer film-forming compositions using carbazole novolac are disclosed (see Patent Document 8).

Resist underlayer film-forming compositions using polynuclear phenol novolac are disclosed (see Patent Document 9).

PRIOR ART DOCUMENTS

Patent Documents

Patent Document 1: Japanese Patent Application Publication No. 2-293850 (JP 2-293850 A)
Patent Document 2: Japanese Patent Application Publication No. 1-154050 (JP 1-154050 A)
Patent Document 3: Japanese Patent Application Publication No. 2-22657 (JP 2-22657 A)
Patent Document 4: Japanese Patent Application Publication No. 2005-128509 (JP 2005-128509 A)
Patent Document 5: Japanese Patent Application Publication No. 2007-199653 (JP 2007-199653 A)
Patent Document 6: Japanese Patent Application Publication No. 2007-178974 (JP 2007-178974 A)
Patent Document 7: U.S. Pat. No. 7,378,217
Patent Document 8: International publication WO2010/147155
Patent Document 9: Japanese Patent Application Publication No. 2006-259249 (JP 2006-259249 A)

SUMMARY OF THE INVENTION

Problem to be Solved by the Invention

It is desirable that the resist underlayer film-forming composition be applied to a silicon wafer using a spin coater and a film be formed, like a resist composition, from the viewpoints of productivity and economy. However, in order to achieve good coating property of such a coating-type resist underlayer film-forming composition, it is necessary that a polymer resin that is a main component of the resist underlayer film-forming composition, a crosslinker, a crosslinking catalyst, and the like be dissolved in an appropriate solvent. Typical examples of such a solvent include propylene glycol monomethyl ether (PGME), propylene glycol monomethyl ether acetate (PGMEA), and cyclohexanone that are used in a resist-forming composition. It is necessary that the resist underlayer film-forming composition have good solubility in the solvents.

In order to solve the problems, an object of the present invention is to provide a resist underlayer film-forming composition for lithography that has high solubility in a resist solvent (solvent used in lithography) for expressing good coating film forming property and a smaller selection ratio of dry etching rate as compared with a resist. Another object of the present invention is to provide a method for forming a resist pattern using the resist underlayer film-forming composition, and a method for producing a semiconductor device.

Means for Solving the Problems

A first aspect of the present invention is a resist underlayer film-forming composition containing a novolac resin containing a structure (C) obtained by a reaction of an aromatic ring of an aromatic compound (A) with a hydroxy group-containing aromatic methylol compound (B).

A second aspect is the resist underlayer film-forming composition according to the first aspect, wherein the aromatic compound (A) is a component constituting the structure (C) in the novolac resin.

A third aspect is the resist underlayer film-forming composition according to the first or second aspect, wherein the hydroxy group-containing aromatic methylol compound (B) is a compound of Formula (1):

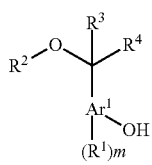

Formula (1)

(in Formula (1), $Ar^1$ is a $C_{6-40}$ aryl group, $R^1$ is a $C_{1-10}$ alkyl group, a $C_{2-10}$ alkenyl group, a $C_{2-10}$ alkynyl group, a $C_{6-40}$ aryl group, a hydroxy group, a cyano group, a nitro group, an amino group, a carboxyl group, an acetyl group, a halogenomethyl group, a —Y—Z group, a halogen atom, or a combination thereof, Y is an oxygen atom, a sulfur atom, a carbonyl group, or an ester group, Z is a $C_{1-10}$ alkyl group, $R^2$ is a hydrogen atom or a methyl group, $R^3$ and $R^4$ are each a hydrogen atom, a $C_{1-10}$ alkyl group, a $C_{2-10}$ alkenyl group, a cyano group, or an alkylamino group, m is an integer ranging from 0 to (4+2n), and n is the condensation degree of a benzene ring which the aryl group $Ar^1$ has).

A fourth aspect is the resist underlayer film-forming composition according to any one of the first to third aspects, wherein the hydroxy group-containing aromatic methylol compound (B) is 2-hydroxybenzyl alcohol, 4-hydroxybenzyl alcohol, or 2,6-di-tert-butyl-4-hydroxymethyl phenol.

A fifth aspect is the resist underlayer film-forming composition according to any one of the first to fourth aspects, wherein the structure (C) has a structure of Formula (2):

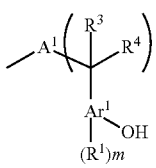

Formula (2)

(in Formula (2), $Ar^1$, $R^1$, $R^3$, $R^4$, and m are the same as in Formula (1), and $A^1$ is the aromatic ring of the aromatic compound (A) or the aromatic ring of the novolac resin).

A sixth aspect is the resist underlayer film-forming composition according to any one of the first to fifth aspects, wherein the aromatic compound (A) is an aromatic amine or a phenolic hydroxy group-containing compound.

A seventh aspect is the resist underlayer film-forming composition according to any one of the first to sixth aspects, wherein the novolac resin is a resin produced by a reaction of an aromatic amine or a phenolic hydroxy group-containing compound with aldehyde or ketone.

An eighth aspect is the resist underlayer film-forming composition according to the seventh aspect, wherein the aromatic amine is phenyl indole or phenyl naphthylamine.

A ninth aspect is the resist underlayer film-forming composition according to the seventh aspect, wherein the phenolic hydroxy group-containing compound is phenol, dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, or 1,1,2,2-tetrakis(4-hydroxyphenyl)ethane.

A tenth aspect is the resist underlayer film-forming composition according to any one of the seventh to ninth aspects, wherein the aldehyde is naphthaldehyde or pyrenecarboxyaldehyde.

An eleventh aspect is the resist underlayer film-forming composition according to any one of the first to tenth aspects, further comprising a solvent.

A twelfth aspect is the resist underlayer film-forming composition according to any one of the first to eleventh aspects, further comprising an acid and/or an acid generator.

A thirteenth aspect is the resist underlayer film-forming composition according to any one of the first to twelfth aspects, further comprising a crosslinker.

A fourteenth aspect is a method for forming a resist pattern used in production of a semiconductor comprising the step of applying the resist underlayer film-forming composition according to any one of the first to thirteenth aspects to a semiconductor substrate followed by firing, to form an underlayer film.

A fifteenth aspect is a method for producing a semiconductor device comprising the steps of forming an underlayer film on a semiconductor substrate using the resist underlayer film-forming composition according to any one of the first to thirteenth aspects, forming a resist film on the underlayer film, forming a resist pattern by irradiation with light or an electron beam and development, etching the underlayer film through the resist pattern, and processing the semiconductor substrate through the patterned underlayer film.

A sixteenth aspect is a method for producing a semiconductor device comprising the steps of forming an underlayer film on a semiconductor substrate using the resist underlayer film-forming composition according to any one of the first to thirteenth aspects, forming a hard mask on the underlayer film, forming a resist film on the hard mask, forming a resist pattern by irradiation with light or an electron beam and development, etching the hard mask through the formed resist pattern, etching the underlayer film through the patterned hard mask, and processing the semiconductor substrate through the patterned underlayer film.

A seventeenth aspect is the production method according to the sixteenth aspect, wherein the hard mask is a vapor deposition film of an inorganic substance.

Effects of the Invention

The resist underlayer film-forming composition of the present invention is effective in a lithography process in which at least two layers of resist underlayer film are formed for a decrease in film thickness of the resist film and the resist underlayer film is used as an etching mask. The resist underlayer film-forming composition has high dry etching resistance against an etching gas such as fluorocarbon. In addition, the resist underlayer film-forming composition has sufficient etching resistance against a processing substrate (e.g., thermal silicon oxide film, silicon nitride film, and poly-silicon film on the substrate) when the substrate is processed using the resist underlayer film of the present invention.

In particular, the resist underlayer film-forming composition of the present invention is a coating-type composition that has high solubility in a resist solvent and excellent spin coating property. The resist underlayer film obtained from the resist underlayer film-forming composition of the present invention is not dissolved again in the resist solvent after coating and firing.

MODES FOR CARRYING OUT THE INVENTION

The present invention is a resist underlayer film-forming composition containing a novolac resin containing a structure (C) obtained by a reaction of an aromatic ring of an aromatic compound (A) with a hydroxy group-containing aromatic methylol compound (B).

In the present invention, the resist underlayer film-forming composition for lithography contains the resin and a solvent. The composition may contain a crosslinker, an acid, an acid generator, a surfactant, or the like, if necessary.

The solid content of the composition is 0.1 to 70% by mass, or 0.1 to 60% by mass. The solid content is a content ratio of all components other than the solvent in the resist underlayer film-forming composition. The solid content may contain the polymer in an amount of 1 to 100% by mass, 1 to 99.9% by mass, 50 to 99.9% by mass, 50 to 95% by mass, or 50 to 90% by mass.

The polymer (resin) used in the present invention has a weight average molecular weight of 600 to 1,000,000, or 600 to 200,000.

Examples of the hydroxy group-containing aromatic methylol compound (B) include compounds containing a methylol group or a methoxymethyl group having a structure of Formula (1).

In Formula (1), $Ar^1$ is a $C_{6-40}$ aryl group, and $R^1$ is a $C_{1-10}$ alkyl group, a $C_{2-10}$ alkenyl group, a $C_{2-10}$ alkynyl group, a $C_{6-40}$ aryl group, a hydroxy group, a cyano group, a nitro group, an amino group, a carboxyl group, an acetyl group, a halogenomethyl group, a —Y—Z group, a halogen atom, or a combination thereof, Y is an oxygen atom, a sulfur atom, a carbonyl group, or an ester group, Z is a $C_{1-10}$ alkyl group, $R^2$ is a hydrogen atom or a methyl group, $R^3$ and $R^4$ are each a hydrogen atom, a $C_{1-10}$ alkyl group, a $C_{2-10}$ alkenyl group, a cyano group, or an alkylamino group, m is an integer ranging from 0 to (4+2n), and n is the condensation degree of a benzene ring which the aryl group $Ar^1$ has.

The alkyl group is a $C_{1-10}$ alkyl group, and examples thereof include methyl group, ethyl group, n-propyl group, i-propyl group, cyclopropyl group, n-butyl group, i-butyl group, sec-butyl group, tert-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-isopropyl-cyclopropyl group, 2-isopropyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The aryl group is a $C_{6-40}$ aryl group, and examples thereof include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

The alkenyl group is a $C_{2-10}$ alkenyl group, and examples thereof include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-isopropylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, a 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-sec-butylethenyl group, 1,3-dimethyl-1-butenyl group, 1,3-dimethyl-2-butenyl group, 1,3-dimethyl-3-butenyl group, 1-isobutylethenyl group, 2,2-dimethyl-3-butenyl group, 2,3-dimethyl-1-butenyl group, 2,3-dimethyl-2-butenyl group, 2,3-dimethyl-3-butenyl group, 2-isopropyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-tert-butylethenyl group, 1-methyl-1-ethyl-2-propenyl group, 1-ethyl-2-methyl-1-propenyl group, 1-ethyl-2-methyl-2-propenyl group, 1-isopropyl-1-propenyl group, 1-isopropyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the alkynyl group include ethynyl group and propargyl group.

In the —Y—Z group, Y is an oxygen atom, a sulfur atom, a carbonyl group, or an ester group, and Z is a $C_{1-10}$ alkyl group.

Examples of the alkylamino group include methylamino group, ethylamino group, n-propylamino group, isopropylamino group, cyclopropylamino group, n-butylamino group, isobutylamino group, s-butylamino group, tert-butylamino group, cyclobutylamino group, 1-methyl-cyclopropylamino group, 2-methyl-cyclopropylamino group, n-pentylamino group, 1-methyl-n-butylamino group, 2-methyl-n-butylamino group, 3-methyl-n-butylamino group, and 1,1-dimethyl-n-propylamino group.

Examples of the hydroxyl group-containing aromatic methylol compound (B) having the structure of Formula (1) include as follows.

Formula (1-1)
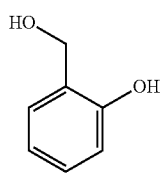

Formula (1-2)
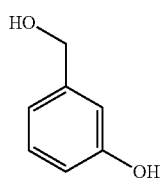

Formula (1-3)
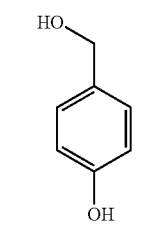

Formula (1-4)
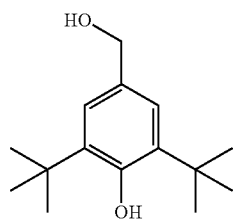

Formula (1-5)
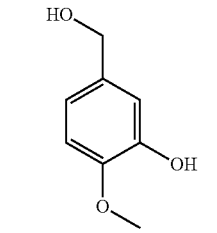

Formula (1-6)
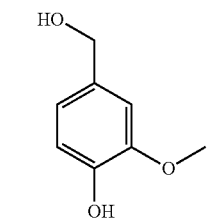

Formula (1-7)
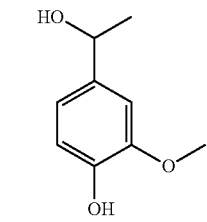

Formula (1-8)
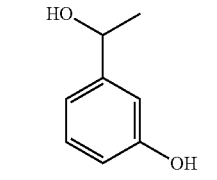

Formula (1-9)
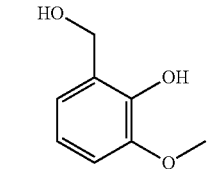

Formula (1-10)
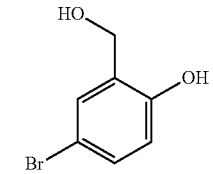

Formula (1-12)

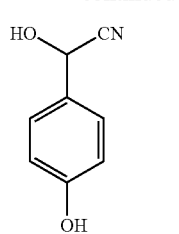

Formula (1-13)

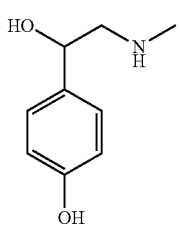

Formula (1-14)

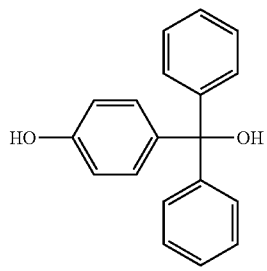

Formula (1-15)

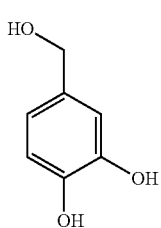

Formula (1-16)

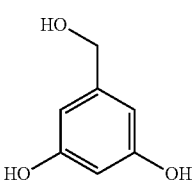

It is preferable that the hydroxyl group-containing aromatic methylol compound (B) be 2-hydroxybenzyl alcohol, 3-hydroxybenzyl alcohol, 4-hydroxybenzyl alcohol, 2,6-di-tert-butyl-4-hydroxymethyl phenol, 3-hydroxy-4-methoxybenzyl alcohol, 4-hydroxy-3-methoxybenzyl alcohol, 4-hydroxy-3-methoxy-α-methylbenzyl alcohol, 3-hydroxy-α-methylbenzyl alcohol, 2-hydroxy-3-methoxybenzyl alcohol, 5-bromo-2-hydroxybenzyl alcohol, DL-4-hydroxymandelonitrile, synephrine, (4-hydroxyphenyl)diphenyl methanol, 3,4-dihydroxybenzyl alcohol, or 3,5-dihydroxybenzyl alcohol.

Examples of the aromatic compound (A) containing an aromatic ring include an aromatic amine and a phenolic hydroxy group-containing compound.

It is preferable that the aromatic amine be a $C_{6-40}$ amine. Examples thereof include aniline, naphthylamine, phenylnaphthylamine, phenylindole, and carbazole. Phenylnaphthylamine or phenylindole can be suitably used.

Examples of the phenolic hydroxy group-containing compound include $C_{6-40}$ compounds, and specific examples thereof include phenol, dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, and 1,1,2,2-tetrakis(4-hydroxyphenyl)ethane.

Examples of the structure (C) obtained by a reaction of the aromatic ring of the aromatic compound (A) with the hydroxy group-containing aromatic methylol compound (B) include resins having the structure of Formula (2).

In Formula (2), $Ar^1$, $R^1$, $R^2$, and m are the same as in Formula (1), and $A^1$ is the aromatic ring of the aromatic compound (A) or the aromatic ring of the novolac resin.

Specifically, $Ar^1$ is a $C_{6-40}$ aryl group, $R^1$ is a $C_{1-10}$ alkyl group, a $C_{2-10}$ alkenyl group, a $C_{2-10}$ alkynyl group, a $C_{6-40}$ aryl group, a hydroxy group, a cyano group, a nitro group, an amino group, a carboxyl group, an acetyl group, a halogenomethyl group, a —Y—Z group, a halogen atom, or a combination thereof, Y is an oxygen atom, a sulfur atom, a carbonyl group, or an ester group, and Z is a $C_{1-10}$ alkyl group, $R^2$ is a hydrogen atom or a methyl group, $R^3$ and $R^4$ are each a hydrogen atom, a $C_{1-10}$ alkyl group, a $C_{2-10}$ alkenyl group, a cyano group, or an alkylamino group, m is an integer ranging from 0 to (4+2n), and n is the condensation degree of a benzene ring which the aryl group $Ar^1$ has.

It is preferable that the reaction of the aromatic compound (A) containing the aromatic ring with the hydroxy group-containing aromatic methylol compound (B) be carried out at a molar ratio of the compound (A) to the compound (B) of 1:0.1 to 8.0, or 1:0.1 to 4.0.

The aromatic compound (A) is a component constituting the structure (C) in the novolac resin. The aromatic compound (A) may be an aromatic amine or a phenolic hydroxy group-containing compound.

Examples of the aromatic amine include phenylindole and phenylnaphthylamine.

Examples of the phenolic hydroxy group-containing compound include phenol, dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, and 1,1,2,2-tetrakis(4-hydroxyphenyl)ethane.

The novolac resin is obtained from any aldehydes or ketones that can be reacted with the aromatic compound (A) containing an aromatic ring.

Examples of the aldehydes or ketones include $C_{6-40}$ aldehydes or ketones, and specific examples thereof include benzaldehyde, naphthaldehyde, phenylbenzaldehyde, and pyrenecarboxyaldehyde. Naphthaldehyde and pyrenecarboxyaldehyde are preferred.

A condensation reaction to form novolac and an addition reaction of the hydroxy group-containing aromatic methylol compound (B) simultaneously advance. As an acid catalyst used in the reactions, mineral acids such as sulfuric acid, phosphoric acid, and perchloric acid, an organic sulfonic acids such as p-toluenesulfonic acid, p-toluenesulfonic acid monohydrate, and methane sulfonic acid, or a carboxylic acids such as formic acid and oxalic acid is used. The amount of acid catalyst to be used is variously selected depending on the kind of used acid. The amount is usually 0.001 to 10,000 parts by mass, preferably 0.01 to 1,000 parts by mass, and more preferably 0.1 to 100 parts by mass, relative to 100 parts by mass of the aromatic compound (A) containing an aromatic ring.

The condensation reaction and the addition reaction are not carried out without a solvent, but are usually carried out using the solvent. Any solvent can be used as long as it does not inhibit the reactions. Examples of the solvent include ethers such as 1,2-dimethoxyethane, diethylene glycol dimethyl ether, propylene glycol monomethyl ether, tetrahydrofuran, and dioxane. When the used acid catalyst is, for example, liquid like formic acid, it can also act as a solvent.

The reaction temperature during condensation is usually 40° C. to 200° C. The reaction time is variously selected depending on the reaction temperature, and is usually about 30 minutes to about 50 hours.

The weight average molecular weight Mw of the polymer obtained as described above is usually 500 to 1,000,000 or 600 to 200,000.

Typical examples of the novolac resin containing the structure (C) obtained by a reaction of the aromatic compound (A) containing the aromatic ring with the hydroxy group-containing aromatic methylol compound (B) include as follows.

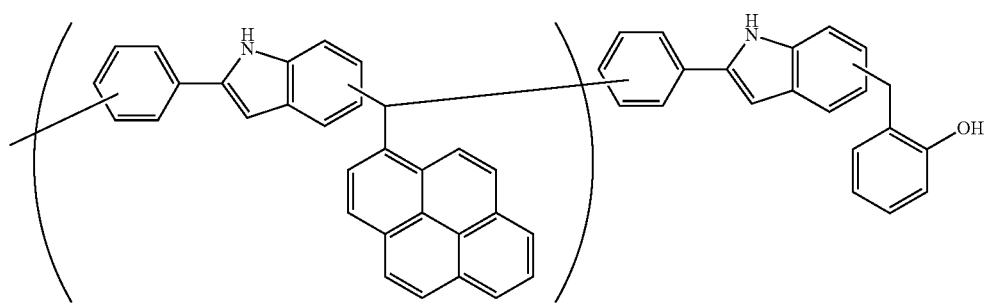

Formula (3-1)

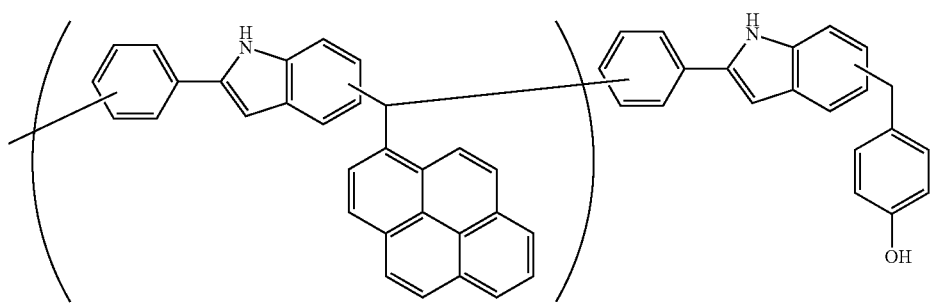

Formula (3-2)

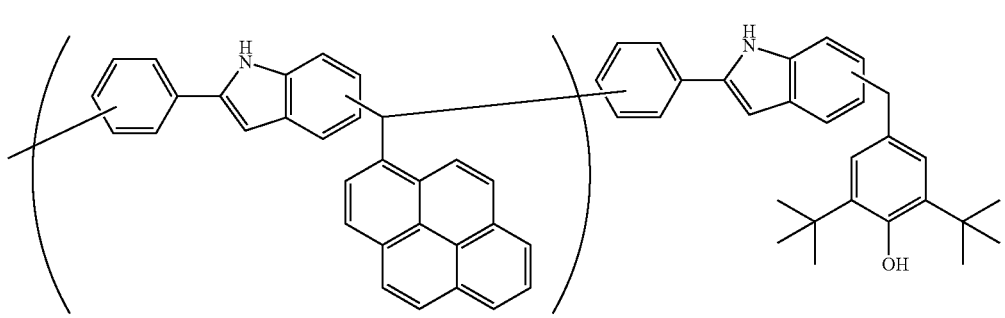

Formula (3-3)

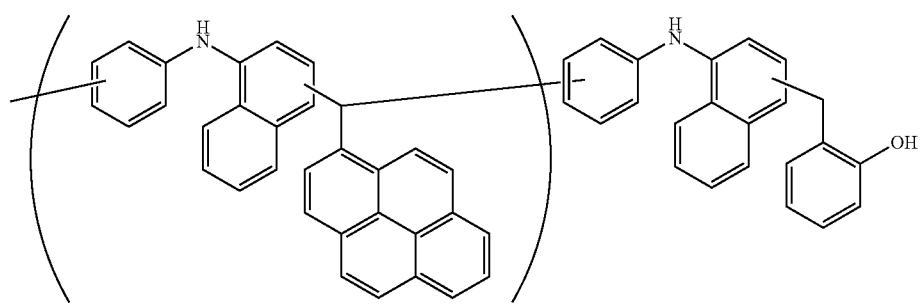

Formula (3-4)

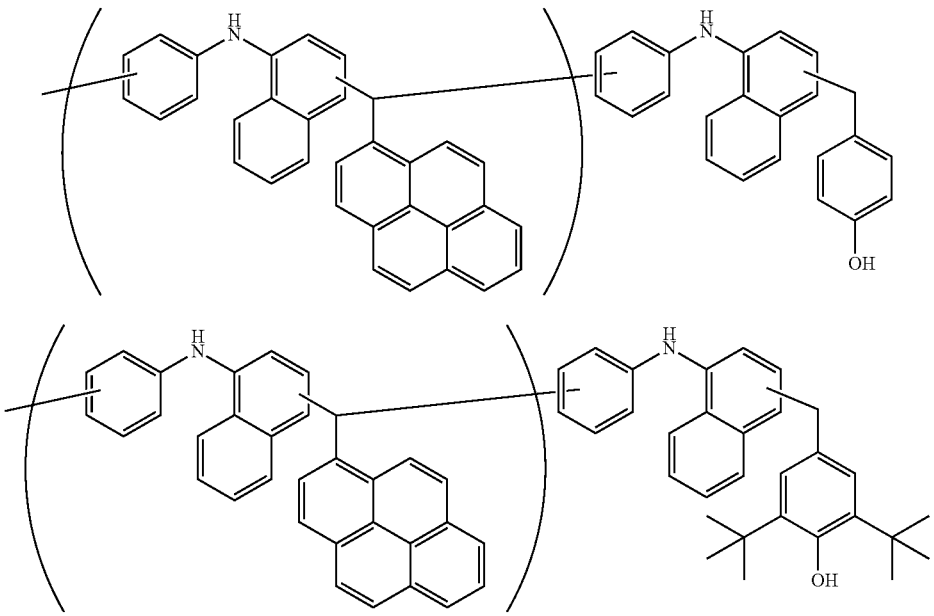

Formula (3-5)

Formula (3-6)

The resist underlayer film-forming composition of the present invention may contain a crosslinker component. Examples of the crosslinker include melamine-based compounds, substituted urea-based compounds, and polymers thereof. A crosslinker having at least two crosslink-forming substituents is preferred. Examples thereof include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, and methoxymethylated thiourea. A condensate of the compounds may be also used.

As the crosslinker, a crosslinker having high heat resistance may be used. As the crosslinker having high heat resistance, a compound containing a crosslink-forming substituent having an aromatic ring (e.g., benzene ring and naphthalene ring) in the molecule may be preferably used.

Examples of the compound include compounds having a substructure of the following Formula (4), and polymers and oligomers having a repeating unit of the following Formula (5).

Formula (4)

Formula (5)

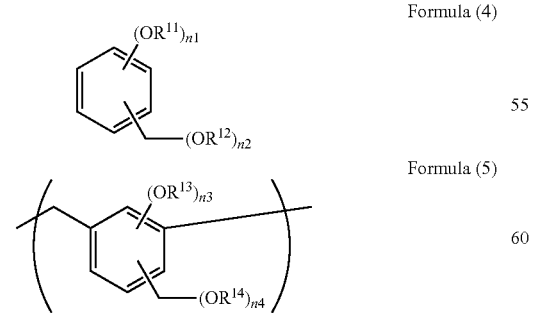

$R^{11}$, $R^{12}$, $R^{13}$, and $R^{14}$ are a hydrogen atom or a $C_{1-10}$ alkyl group, and as the alkyl group, the aforementioned examples may be used.

The compounds of Formula (4) and the polymers and the oligomers of Formula (5) are exemplified below.

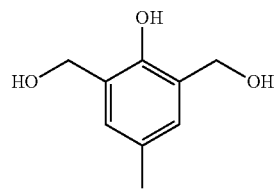

Formula (4-1)

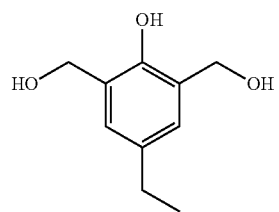

Formula (4-2)

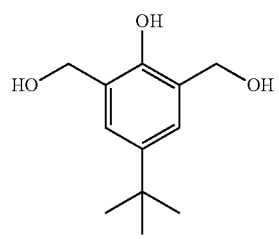

Formula (4-3)

Formula (4-4)
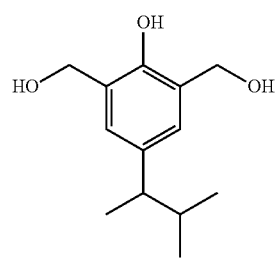
Formula (4-5)
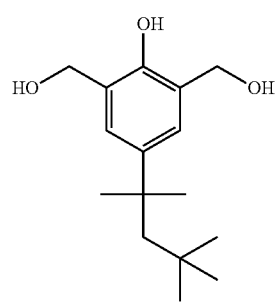
Formula (4-6)
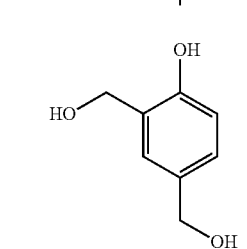
Formula (4-7)
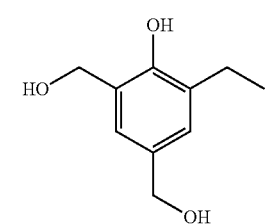
Formula (4-8)
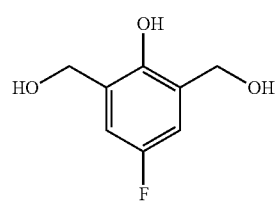
Formula (4-9)
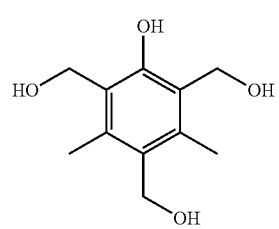
Formula (4-10)
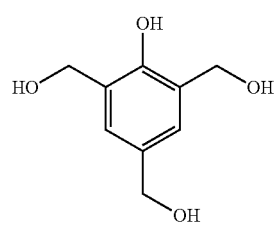
Formula (4-11)
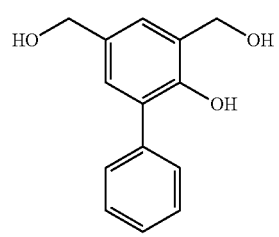
Formula (4-12)
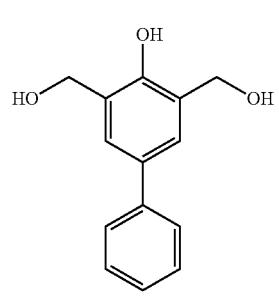
Formula (4-13)
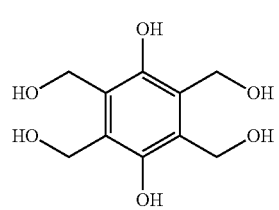
Formula (4-14)
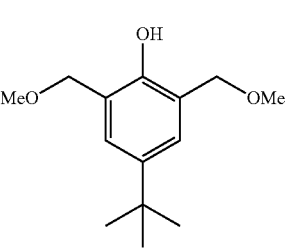
Formula (4-15)
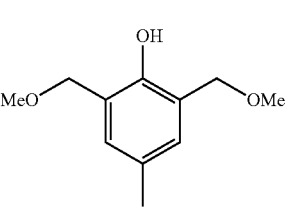
Formula (4-16)
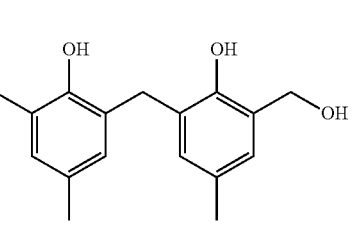

Formula (4-17)
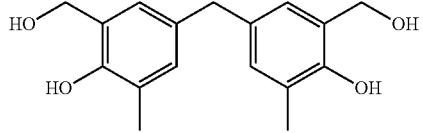

Formula (4-18)
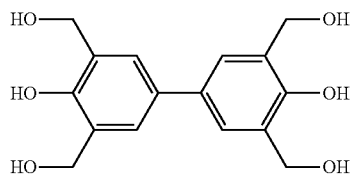

Formula (4-19)
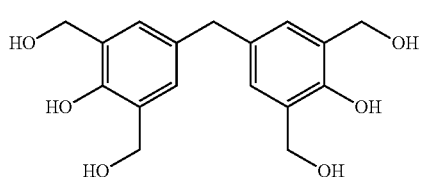

Formula (4-20)
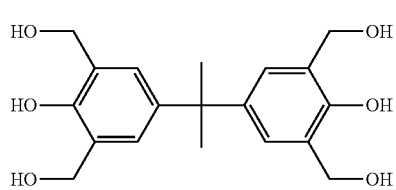

Formula (4-21)
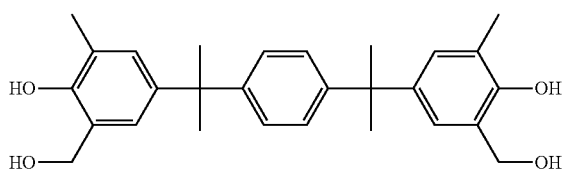

Formula (4-22)
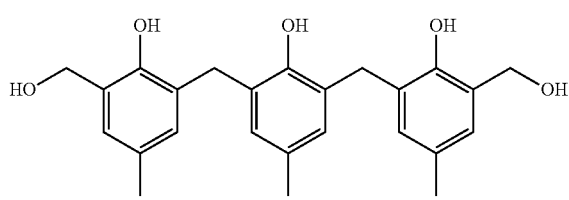

Formula (4-23)
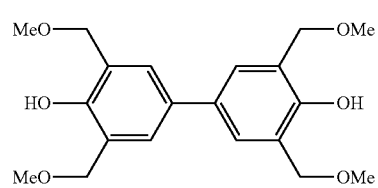

Formula (4-24)
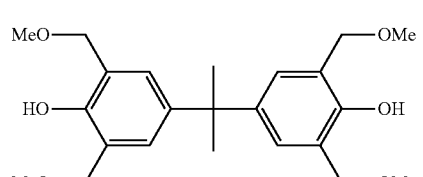

Formula (4-25)
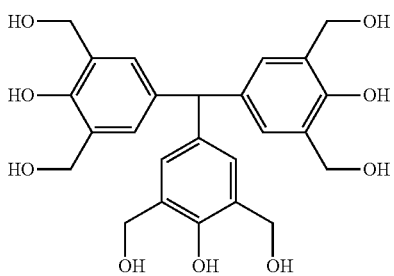

Formula (4-26)
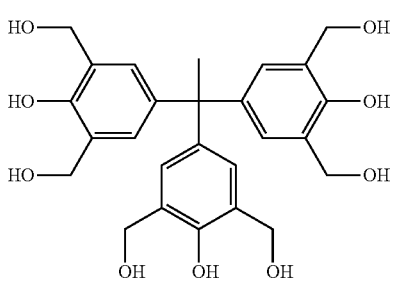

Formula (4-27)
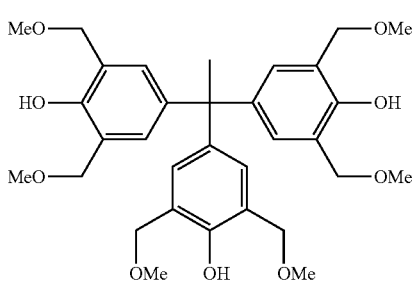

The compounds are available as products available from Asahi Organic Chemicals Industry Co., Ltd., and Honshu Chemical Industry Co., Ltd. Among the crosslinkers, for example, the compound of Formula (4-24) is available as trade name TM-BIP-A available from Asahi Organic Chemicals Industry Co., Ltd.

The amount of crosslinker to be added varies depending on a coating solvent to be used, an underlying substrate to be used, a solution viscosity to be required, and a film form to be required. The amount is 0.001 to 80% by mass, preferably 0.01 to 50% by mass, and further preferably 0.05 to 40% by mass, relative to the total solid content. The crosslinker may cause a cross-linking reaction due to self-condensation. However, when the polymer of the present invention has a crosslinkable substituent, the crosslinker may cause a cross-linking reaction with the crosslinkable substituent.

In the present invention, as a catalyst for promoting the cross-linking reaction, an acid and/or an acid generator may be added. For example, a thermal acid generator including acidic compounds such as p-toluenesulfonic acid, trifluoromethanesulfonic acid, pyridinium p-toluenesulfonic acid, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, and naphthalenecarboxylic acid, and/or 2,4,4,6-tetrabromocyclohexadienone, benzoin tosylate, 2-nitrobenzyl tosylate, and another organic alkyl sulfonic acid ester may be mixed. The amount of the catalyst to be mixed is 0.0001 to 20% by mass, preferably 0.0005 to 10% by mass, and more preferably 0.01 to 3% by mass, relative to the total solid content.

The resist underlayer film-forming composition for lithography of the present invention may contain a photoacid generator in order to coincide the acidity of a photoresist covering an upper layer at a lithography process. Preferable examples of the photoacid generator include onium salt-based photoacid generators such as bis(4-tert-butylphenyl) iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. The amount of the photoacid generator is 0.2 to 10% by mass, and preferably 0.4 to 5% by mass, relative to the total solid content.

In addition, a material for a resist underlayer film for lithography of the present invention may further contain a light absorber, a rheology controlling agent, an adhesive adjuvant, a surfactant, or the like, if necessary.

As the light absorber, for example, a commercially available light absorber described in "Kogyoyoshikiso no gijutsu to shijo" (CMC Publishing Co., Ltd.) or "Senryo binran" (edited by The Society of Synthetic Organic Chemistry, Japan.), for example, C.I. Disperse Yellow 1, 3, 4, 5, 7, 8, 13, 23, 31, 49, 50, 51, 54, 60, 64, 66, 68, 79, 82, 88, 90, 93, 102, 114, or 124; C.I. Disperse Orange 1, 5, 13, 25, 29, 30, 31, 44, 57, 72, or 73; C.I. Disperse Red 1, 5, 7, 13, 17, 19, 43, 50, 54, 58, 65, 72, 73, 88, 117, 137, 143, 199, or 210; C.I. Disperse Violet 43; C.I. Disperse Blue 96; C.I. Fluorescent Brightening Agent 112, 135, or 163; C.I. Solvent Orange 2 or 45; C.I. Solvent Red 1, 3, 8, 23, 24, 25, 27, or 49; C.I. Pigment Green 10; C.I. Pigment Brown 2, or the like can be suitably used. The light absorber is usually mixed in an amount of 10% by mass or less, and preferably 5% by mass or less, relative to the total solid content of the material for a resist underlayer film for lithography.

The rheology controlling agent is added to mainly improve the fluidity of the resist underlayer film-forming composition, and in particular, to improve the film thickness uniformity of the resist underlayer film and enhance the packing property of the inside of holes with the resist underlayer film-forming composition at a baking process. Specific examples thereof include phthalic acid derivatives such as dimethyl phthalate, diethyl phthalate, diisobutyl phthalate, dihexyl phthalate, and butyl isodecyl phthalate, adipic acid derivatives such as dinormal butyl adipate, diisobutyl adipate, diisooctyl adipate, and octyl decyl adipate, maleic acid derivatives such as dinormal butyl malate, diethyl malate, and dinonyl malate, oleic acid derivatives such as methyl oleate, butyl oleate, and tetrahydrofurfuryl oleate, and stearic acid derivatives such as normal butyl stearate and glyceryl stearate. The rheology controlling agent is usually mixed in an amount of less than 30% by mass, relative to the total solid content of the material for a resist underlayer film for lithography.

The adhesive adjuvant is added to mainly improve the adhesion of the substrate or the resist to the resist underlayer film-forming composition, and in particular, not to release the resist by development. Specific examples thereof include chlorosilanes such as trimethylchlorosilane, dimethylmethylolchlorosilane, methyldiphenylchlorosilane, and chloromethyldimethylchlorosilane, alkoxysilanes such as trimethylmethoxysilane, dimethyldiethoxysilane, methyldimethoxysilane, dimethylmethylolethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilyl imidazole, silanes such as methyloltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, and urea or thiourea compounds such as 1,1-dimethylurea and 1,3-dimethylurea. The adhesive adjuvant is usually mixed in an amount of less than 5% by mass, and preferably less than 2% by mass, relative to the total solid content of the material for a resist underlayer film for lithography.

In the material for a resist underlayer film for lithography of the present invention, a surfactant can be mixed to further improve the coating property against unevenness of a surface without generation of pinholes and striation. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop EF301, EF303, and EF352 (trade name, available from Tohkem Products Corporation), MEGAFACE F171, F173, R-40, R-40N, R-30N, and R-40LM (trade name, available from DIC Corporation), Fluorad FC430 and FC431 (trade name, available from Sumitomo 3M, Ltd.), and Asahi Guard AG710, and Surflon S-382, SC101, SC102, SC103, SC104, SC105, and SC106 (trade name, available from Asahi Glass Co., Ltd.), and organosiloxane polymer KP341 (available from Shin-Etsu Chemical Co., Ltd.). The amount of surfactant to be mixed is usually 2.0% by mass or less, and preferably 1.0% by mass or less, relative to the total solid content of the material for a resist underlayer film for lithography of the present invention. The surfactant may be added alone or two or more kinds thereof may be added in combination.

In the present invention, as a solvent capable of dissolving the polymer, the crosslinker component, the cross-linking catalyst, and the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate can be used. The organic solvent may be used alone, or two or more kinds thereof may be used in combination.

Further, a mixture of solvents having a high boiling point such as propylene glycol monobutyl ether and propylene glycol monobutyl ether acetate can be used. Among the solvents, propylene glycol monomethyl ether, propylene glycol monomethyl ether acetate, ethyl lactate, butyl lactate, and cyclohexanone are preferred in terms of improved leveling property. In particular, propylene glycol monomethyl ether and propylene glycol monomethyl ether acetate are preferred.

The resin used in the present invention exhibits high solubility in the solvent generally used at the lithography process, such as propylene glycol monomethyl ether and propylene glycol monomethyl ether acetate.

A resist used in the present invention is a photoresist or an electron beam resist.

As a photoresist applied to a top of a resist underlayer film for lithography in the present invention, any of a negative photoresist and a positive photoresist can be used. Examples thereof may include a positive photoresist including a novolac resin and 1,2-naphthoquinone diazide sulfonic acid ester, a chemically amplified photoresist including a binder having a group that increases an alkali dissolution rate by decomposition with an acid and a photoacid generator, a chemically amplified photoresist including an alkaline soluble binder, a low molecular compound that increases the alkali dissolution rate of the photoresist by decomposition with an acid, and a photoacid generator, a chemically amplified including a binder having a group that increases the alkali dissolution rate by decomposition with an acid, a low molecular compound that increases the alkali dissolution rate of the photoresist by decomposition with the acid, and a photoacid generator, and a photoresist having a Si atom in the skeleton. Specific examples thereof include trade name APEX-E available from Rohm and Haas.

Examples of an electron beam resist applied to the top of the resist underlayer film for lithography in the present invention may include a composition including a resin having a Si—Si bond in the main chain and an aromatic ring at the terminal and an acid generator that generates an acid by irradiation with an electron beam, and a composition including poly(p-hydroxylstyrene) of which a hydroxyl group is substituted with an organic group containing N-carboxyamine and an acid generator that generates an acid by irradiation with an electron beam. The latter electron beam resist composition exhibits alkaline solubility by reacting an acid generated from the acid generator by irradiation with an electron beam with a N-carboxyaminoxy group of a polymer side chain to decompose the polymer side chain into a hydroxyl group, and is dissolved in an alkaline developer to form a resist pattern. Examples of the acid generator that generates an acid by irradiation with an electron beam include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine, onium salts such as a triphenyl sulfonium salt and a diphenyliodonium salt, and sulfonic acid esters such as nitrobenzyl tosylate and dinitrobenzyl tosylate.

As a developer of a resist having a resist underlayer film formed from the material for a resist underlayer film for lithography in the present invention, an aqueous solution of alkali including inorganic alkalis such as sodium hydroxide, potassium hydroxide, sodium carbonate, sodium silicate, sodium methsilicate, and ammonia water, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine can be used. A solution in which proper amounts of an alcohols such as isopropyl alcohol and a surfactant such as a nonionic surfactant are added to the aqueous solution of the alkalis can be used. Among the developers, a quaternary ammonium salt is preferred, and tetramethylammonium hydroxide and choline are further preferred.

As the developer, an organic solvent can be used. Examples thereof include methyl acetate, ethyl acetate, isopropyl acetate, butyl acetate, amyl acetate, isoamyl acetate, ethyl methoxyacetate, ethyl ethoxyacetate, 2-heptanone, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. As the developer, butyl acetate, 2-heptanone, or the like can be preferably used.

Further, a surfactant or the like may be added to the developer. A development condition is appropriately selected from temperatures of 5° C. to 50° C. and times of 10 to 600 seconds.

Hereinafter, a method for forming a resist pattern of the present invention will be described. The resist underlayer film-forming composition is applied to a substrate used in production of a precision integrated circuit element (e.g., a transparent substrate such as a silicon/silicon dioxide coating, a glass substrate, and an ITO substrate) by an appropriate coating method using a spinner or a coater, baked, and cured to form a coating underlayer film. The thickness of the resist underlayer film is preferably 0.01 to 3.0 µm. A baking (curing) condition after the coating is at 80 to 400° C. for 0.5 to 120 minutes. After then, a resist is applied directly to the resist underlayer film, or if necessary, a resist is applied after a coating material of one or more layers is formed on the coating underlayer film. The resist is irradiated with light or an electron beam through a predetermined mask, developed, washed, and dried. Thus, a good resist pattern can be obtained. If necessary, post exposure bake (PEB) can be also carried out after irradiation with light or an electron beam. The resist underlayer film at an area where the resist is developed and removed at the step can be removed by dry etching, to form a desired pattern on the substrate.

The exposure light of the photoresist is actinic radiation such as near ultraviolet light, far ultraviolet light, and extreme ultraviolet light (e.g., EUV, wavelength: 13.5 nm).

For example, light having a wavelength of 248 nm (KrF laser beam), 193 nm (ArF laser beam), or 157 nm ($F_2$ laser beam) can be used. A method for light irradiation can be adopted without particular restriction as long as it is a method capable of generating an acid from the photoacid generator. The exposure dose is 1 to 2,000 mJ/cm$^2$, 10 to 1,500 mJ/cm$^2$, or 50 to 1,000 mJ/cm$^2$.

In irradiation of the electron beam resist with an electron beam, for example, irradiation can be carried out using an electron beam irradiating device.

In the present invention, a semiconductor device can be produced through steps of forming the resist underlayer film on a semiconductor substrate using the resist underlayer film-forming composition, forming a resist film on the resist underlayer film, forming a resist pattern by irradiation with light or an electron beam and development, etching the resist underlayer film through the resist pattern, and processing the semiconductor substrate through the patterned resist underlayer film.

When miniaturization of the resist pattern further advances, a problem of resolution and a problem in which the resist pattern collapses occur after development. For this reason, a decrease in the film thickness of the resist is desired. In this case, it is difficult to obtain a resist pattern film thickness sufficient for substrate processing. A process is required that imparts a function of a mask during substrate processing not only to the resist pattern but also to the resist underlayer film that is formed between the resist and the semiconductor substrate to be processed. Required as the resist underlayer film for such processing are: the resist underlayer film for lithography having a selection ratio of dry etching rate close to that of the resist; a resist underlayer film for lithography having a smaller selection ratio of dry etching rate as compared with the resist; and a resist underlayer film for lithography having a smaller selection ratio of dry etching rate as compared with the semiconductor substrate, unlike a conventional resist underlayer film having high etching rate (etching rate is fast). To such a resist underlayer film, the anti-reflective performance may be imparted, and the resist underlayer film may have a function of the conventional anti-reflective coating.

On the other hand, in order to obtain a finer resist pattern, a process in which the resist pattern and the resist underlayer film are made finer than the pattern width during resist development at the time of dry etching of the resist underlayer film begins to be also used. A resist underlayer film having a selection ratio of dry etching close to that of the resist, which is different from the conventional anti-reflective coating having a high etching rate is required as the resist underlayer film for such a process. To such a resist underlayer film, the anti-reflective performance may be imparted, and the resist underlayer film may have a function of the conventional anti-reflective coating.

In the present invention, the resist underlayer film of the present invention is formed on the substrate, and the resist may be applied directly to the resist underlayer film, or if necessary, after one or more layers of the coating material are formed on the resist underlayer film. In this case, even when the pattern width of the resist decreases and the resist is thinly applied to prevent pattern collapse, the substrate can be processed by selection of appropriate etching gas.

Specifically, the semiconductor device can be produced through steps of forming the resist underlayer film on a semiconductor substrate using the resist underlayer film-forming composition, forming a hard mask using a coating material containing a silicon component or the like on the resist underlayer film or forming a hard mask (e.g., from silicon nitride oxide) by vapor deposition, forming a resist film on the hard mask, forming a resist pattern by irradiation with light or an electron beam and development, etching the hard mask through the resist pattern by halogen-based gas, etching the resist underlayer film through the patterned hard mask by oxygen-based gas or hydrogen-based gas, and processing the semiconductor substrate through the patterned resist underlayer film by halogen-based gas.

In consideration of effects as the anti-reflective coating, a light absorption moiety is incorporated in the scaffold of the resist underlayer film-forming composition for lithography of the present invention. Therefore, a substance is not diffused in the photoresist during heating and drying, and the light absorption moiety has sufficiently large light absorption performance. Accordingly, the resist underlayer film-forming composition has a high reflective light prevention effect.

The resist underlayer film-forming composition for lithography of the present invention has high thermal stability, and can prevent pollution of the top layer due to the decomposed substance during firing, and impart a margin of temperature at a firing step.

The material for a resist underlayer film for lithography of the present invention can be used for a film having a function of preventing the reflection of light depending on a process condition, and a function of preventing an interaction between a substrate and a photoresist or a bad influence on the substrate of a material used for the photoresist or a substance produced during exposure of the photoresist to light.

EXAMPLES

Example 1

29.96 g of propylene glycol monomethyl ether was added to 8.00 g of 2-phenylindole, 5.72 g of 1-pyrenecarboxyaldehyde, 2.06 g of 2-hydroxybenzyl alcohol, and 0.36 g of methanesulfonic acid, and the mixture was stirred at 130° C. for 24 hours under a nitrogen atmosphere. The reaction liquid was added dropwise to methanol, and the deposited resin was filtered out, washed, and dried at 70° C. under reduced pressure to obtain 6.15 g of resin containing Formula (3-1). The weight average molecular weight in terms of standard polystyrene measured by GPC of the resin was 1,370.

Subsequently, 1.00 g of the obtained resin and 0.002 g of surfactant (available from DIC Corporation, trade name: MEGAFACE (product name) R-40, fluorosurfactant) were dissolved in 5.70 g of propylene glycol momomethyl ether and 13.30 g of propylene glycol monomethyl ether acetate to prepare a resist underlayer film-forming composition.

Example 2

29.96 g of propylene glycol monomethyl ether was added to 8.00 g of 2-phenylindole, 5.72 g of 1-pyrenecarboxyaldehyde, 2.06 g of 4-hydroxybenzyl alcohol, and 0.36 g of methanesulfonic acid, and the mixture was stirred at 130° C. for 24 hours under a nitrogen atmosphere. The reaction liquid was added dropwise to methanol, and the deposited resin was filtered out, washed, and dried at 70° C. under reduced pressure to obtain 5.52 g of resin containing Formula (3-2). The weight average molecular weight in terms of standard polystyrene measured by GPC of the resin was 1,100.

Subsequently, 1.00 g of the obtained resin and 0.002 g of surfactant (available from DIC Corporation, trade name: MEGAFACE (product name) R-40, fluorosurfactant) were dissolved in 5.70 g of propylene glycol momomethyl ether and 13.30 g of propylene glycol monomethyl ether acetate to prepare a resist underlayer film-forming composition.

Example 3

31.32 g of propylene glycol monomethyl ether was added to 7.50 g of 2-phenylindole, 5.36 g of 1-pyrenecarboxyaldehyde, 3.70 g of 2,6-di-tert-butyl-4-hydroxymethylphenol, and 0.34 g of methanesulfonic acid, and the mixture was stirred at 130° C. for 24 hours under a nitrogen atmosphere. The reaction liquid was added dropwise to methanol, and the deposited resin was filtered out, washed, and dried at 70° C. under reduced pressure to obtain 6.45 g of resin containing Formula (3-3). The weight average molecular weight in terms of standard polystyrene measured by GPC of the resin was 1,510.

Subsequently, 1.00 g of the obtained resin and 0.002 g of surfactant (available from DIC Corporation, trade name: MEGAFACE (product name) R-40, fluorosurfactant) were dissolved in 5.70 g of propylene glycol momomethyl ether and 13.30 g of propylene glycol monomethyl ether acetate to prepare a resist underlayer film-forming composition.

Example 4

40.00 g of 1,4-dioxane was added to 10.00 g of phenyl-1-naphthylamine, 10.50 g of 1-pyrenecarboxyaldehyde, 5.39 g of 2,6-di-tert-butyl-4-hydroxymethyl phenol, and 0.99 g of methanesulfonic acid, and the mixture was stirred with reflux for 24 hours under a nitrogen atmosphere. The reaction liquid was added dropwise to methanol, and the deposited resin was filtered out, washed, and dried at 70° C. under reduced pressure to obtain 15.58 g of resin containing Formula (3-6). The weight average molecular weight in terms of standard polystyrene measured by GPC of the resin was 2,600.

Subsequently, 1.00 g of the obtained resin and 0.002 g of surfactant (available from DIC Corporation, trade name: MEGAFACE (product name) R-40, fluorosurfactant) were dissolved in 13.30 g of cyclohexanone and 5.70 g of propylene glycol momomethyl ether acetate to prepare a resist underlayer film-forming composition.

Comparative Example 1

5.64 g of propylene glycol monomethyl ether and 22.57 g of propylene glycol monomethyl ether acetate were added to 8.39 g of 2-phenylindole, 10.00 g of 1-pyrenecarboxyaldehyde, and 0.42 g of methanesulfonic acid, and the mixture was stirred at 130° C. for 24 hours under a nitrogen atmosphere. The reaction liquid was added dropwise to methanol, and the deposited resin was filtered out, washed, and dried at 70° C. under reduced pressure to obtain 15.10 g of resin containing the following Formula (5-1). The weight average molecular weight in terms of standard polystyrene measured by GPC of the resin was 1,200.

Subsequently, 1.00 g of the obtained resin and 0.002 g of surfactant (available from DIC Corporation, trade name: MEGAFACE (product name) R-40, fluorosurfactant) were dissolved in 5.70 g of propylene glycol monomethyl ether and 13.30 g of cyclohexanone to prepare a resist underlayer film-forming composition.

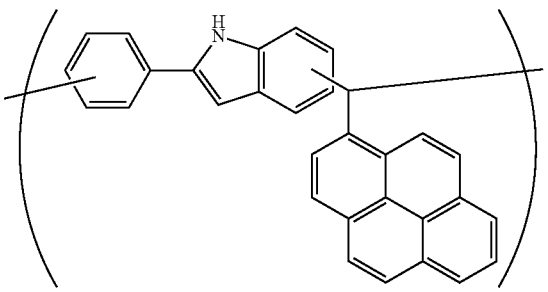

Formula (5-1)

Comparative Example 2

17.27 g of 1,4-dioxane and 17.27 g of toluene were added to 11.00 g of phenyl-1-naphthylamine, 11.55 g of 1-pyrenecarboxyaldehyde, and 0.48 g of methanesulfonic acid, and the mixture was stirred with reflux for 16 hours under a nitrogen atmosphere. The reaction liquid was added dropwise to methanol, and the deposited resin was filtered out, washed, and dried at 70° C. under reduced pressure to obtain 19.88 g of resin containing the following Formula (5-2). The weight average molecular weight in terms of standard polystyrene measured by GPC of the resin was 900.

Subsequently, 1.00 g of the obtained resin and 0.002 g of surfactant (available from DIC Corporation, trade name: MEGAFACE (product name) R-40, fluorosurfactant) were dissolved in 5.70 g of propylene glycol momomethyl ether and 13.30 g of cyclohexanone to prepare a resist underlayer film-forming composition.

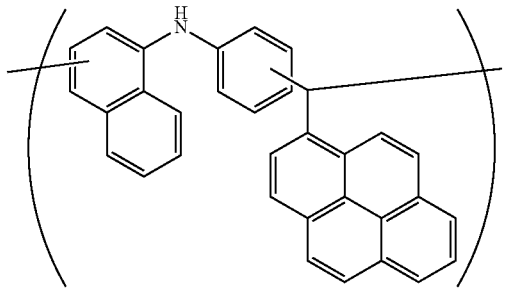

Formula (5-2)

Comparative Example 3

36.84 g of propylene glycol monomethyl ether was added to 10.00 g of 2-phenylindole, 7.15 g of 1-pyrenecarboxyaldehyde, 2.24 g of benzyl alcohol, and 0.45 g of methanesulfonic acid, and the mixture was stirred at 130° C. for 22 hours under a nitrogen atmosphere. The reaction liquid was added dropwise to methanol, and the deposited resin was filtered out, washed, and dried at 70° C. under reduced pressure to obtain 9.70 g of resin containing the following Formula (5-3). The weight average molecular weight in terms of standard polystyrene measured by GPC of the resin was 1,270.

Subsequently, 1.00 g of the obtained resin and 0.002 g of surfactant (available from DIC Corporation, trade name: MEGAFACE (product name) R-40, fluorosurfactant) were dissolved in 5.70 g of propylene glycol momomethyl ether and 13.30 g of cyclohexanone to prepare a resist underlayer film-forming composition.

Formula (5-3)

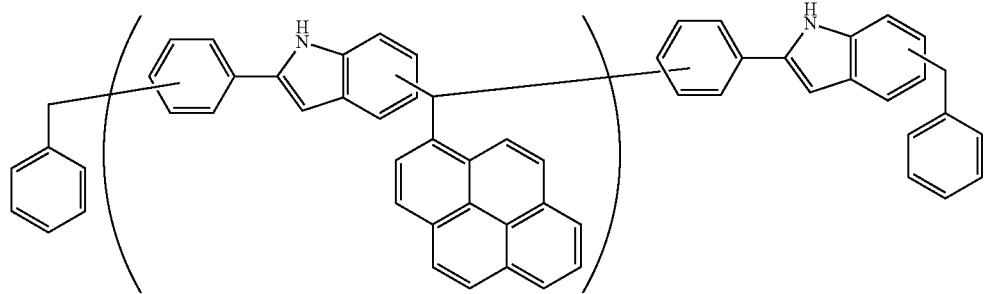

Comparative Example 4

37.37 g of propylene glycol monomethyl ether was added to 10.00 g of 2-phenylindole, 7.15 g of 1-pyrenecarboxyaldehyde, 2.52 g of salicylaldehyde, and 0.45 g of methanesulfonic acid, and the mixture was stirred at 130° C. for 22 hours under a nitrogen atmosphere. The reaction liquid was added dropwise to methanol, and the deposited resin was filtered out, washed, and dried at 70° C. under reduced pressure to obtain 9.84 g of resin containing the following Formula (5-4). The weight average molecular weight in terms of standard polystyrene measured by GPC of the resin was 1,360.

Subsequently, 1.00 g of the obtained resin and 0.002 g of surfactant (available from DIC Corporation, trade name: MEGAFACE (product name) R-40, fluorosurfactant) were dissolved in 5.70 g of propylene glycol momomethyl ether and 13.30 g of cyclohexanone to prepare a resist underlayer film-forming composition.

Formula (5-4)

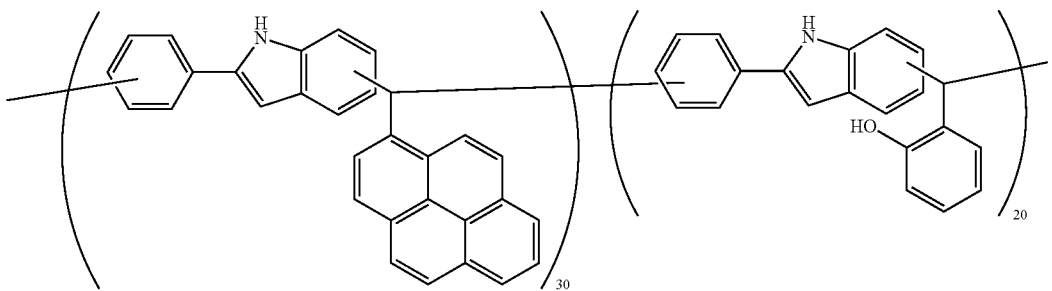

Comparative Example 5

150 g of propylene glycol monomethyl ether was added to 60.00 g of m-cresol, 27.00 g of 37% formalin aqueous solution, and 1.60 g of p-toluene sulfonic acid monohydrate, and the mixture was stirred with reflux for 24 hours under a nitrogen atmosphere. The reaction liquid was added dropwise to methanol, and the deposited resin was filtered out, washed, and dried at 70° C. under reduced pressure. Subsequently, 4.13 g of 9-anthracenemethanol, 28.80 g of THF, and 0.52 g of p-toluene sulfonic acid monohydrate were added to 12.02 g of the obtained resin, and the mixture was stirred with reflux for 24 hours under a nitrogen atmosphere. The reaction liquid was added dropwise to methanol, and the deposited resin was filtered out, washed, and dried at 70° C. under reduced pressure to obtain 2.75 g of resin containing the following Formula (5-5). The weight average molecular weight in terms of standard polystyrene measured by GPC of the resin was 1,470.

Subsequently, 1.00 g of the obtained resin and 0.002 g of surfactant (available from DIC Corporation, trade name: MEGAFACE (product name) R-40, fluorosurfactant) were dissolved in 5.70 g of propylene glycol momomethyl ether and 13.30 g of propylene glycol monomethyl ether acetate to prepare a resist underlayer film-forming composition.

Formula (5-5)

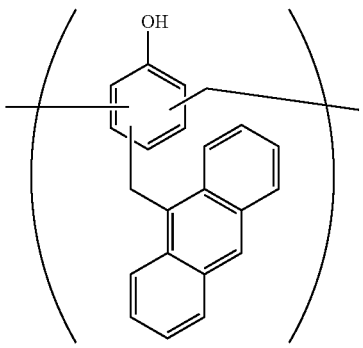

(Solubility Test)

A 30% by mass solution of each of the resins obtained in Examples 1 to 4 and Comparative Examples 1 to 3 in propylene glycol monomethyl ether (PGME), which was a typical resist solvent, was prepared. At that time, a homogeneous solution in which the resin was dissolved was judged as "good" solubility, and a suspension in which the resin was not sufficiently dissolved was judged as "poor" solubility. The results of the solubility test of the resins are shown in Table 1.

TABLE 1

Solubility Test of Resin

| Resin | PGME |
|---|---|
| Example 1 | Good |
| Example 2 | Good |
| Example 3 | Good |
| Example 4 | Good |
| Comparative Example 1 | Poor |
| Comparative Example 2 | Poor |
| Comparative Example 3 | Poor |

From the results of Table 1, it was confirmed that the resins of Examples 1 to 4 exhibit higher solubility in PGME, which was a typical resist solvent, than Comparative Examples 1 to 3.

(Measurement of Dry Etching Rate)

As an etcher and an etching gas used in measurement of dry etching rate, the following etcher and gas were used.

ES401 (available from NIPPON SCIENTIFIC Co., Ltd.): $CF_4$

A solution of each of the resist underlayer film-forming compositions prepared in Examples 1 to 4 and Comparative Examples 4 and 5 were each applied to a silicon wafer using a spin coater, and fired on a hot plate at 400° C. for 2 minutes to form a resist underlayer film (thickness: 0.25 μm). The dry etching rate was measured using $CF_4$ gas as an etching gas.

A solution of phenol novolac resin (article on the market, weight average molecular weight Mw measured by GPC in terms of polystyrene: 2,000, polydispersity Mw/Mn: 2.5) was similarly applied to a silicon wafer using a spin coater, and fired at 205° C. for 1 minute, to form a film. The dry etching rate was measured using $CF_4$ gas as an etching gas. The dry etching rates of the resist underlayer films in Examples 1 to 4 and Comparative Examples 4 and 5 were compared with the dry etching rate of phenol novolac resin when the etching rate of phenol novolac resin film (thickness: 0.25 μm) obtained by firing at 205° C. for 1 minute was 1.00. The results are shown in Table 2. A rate ratio is a ratio of the dry etching rate of (resist underlayer film)/the dry etching rate of (phenol novolac resin film).

TABLE 2

Dry Etching Rate Ratio

| | Rate ratio of fired film at 400° C. |
|---|---|
| Example 1 | 0.72 |
| Example 2 | 0.73 |
| Example 3 | 0.72 |
| Example 4 | 0.71 |
| Comparative Example 4 | 0.76 |
| Comparative Example 5 | 1.06 |

In the novolac resin containing the structure (C) used in the present invention, it is necessary that the hydroxyl group-containing aromatic methylol compound (B) contains a hydroxyl group. When the compound (B) does not contain a hydroxy group (Comparative Example 3), the solubility in the solvent is insufficient.

When a novolac resin is produced using aldehyde in which the aromatic compound (A) contains a hydroxy group (Comparative Example 4), the novolac resin has a structure in which the hydroxy group exists on a side chain extending from a novolac polymer main chain. Thus, the dry etching rate is increased, and the performance as a hard mask is reduced.

In the polymer used in the present invention, the hydroxy group-containing aromatic methylol compound (B) may exist at a terminal of novolac resin. When the polymer having such a structure is used, the solubility in the solvent is improved, dissolution failure that generates a foreign object on a substrate during coating of the substrate is prevented, and an underlayer film obtained by curing after coating exhibits high etching resistance, and has good hard mask property.

INDUSTRIAL APPLICABILITY

Accordingly, the material for a resist underlayer film of the present invention used in a lithography process using a multilayer film has not only high dry etching resistance and anti-reflective coating function, but also excellent spin coating property due to high solubility in a resist solvent (solvent used in lithography). Therefore, occurrence of wiggling (bending at an irregular pattern) of the resist underlayer film during a dry etching process is suppressed without intermixing (mixing of layers) between the obtained resist underlayer film and a top coating resist. Thus, fine processing of a substrate is achieved.

The invention claimed is:

1. A resist underlayer film-forming composition containing a novolac resin, wherein
the novolac resin is obtained by:
a reaction of an aromatic ring of an aromatic compound (A) with a hydroxy group-containing aromatic methylol compound (B), wherein the aromatic compound (A) is phenylindole or phenylnaphthylamine and the hydroxy group-containing aromatic methylol compound (B) is 2-hydroxybenzyl alcohol, 4-hydroxybenzyl alcohol, or 2,6-di-tert-butyl-4-hydroxymethyl phenol; and
a condensation reaction to form novolac comprising a reaction of the aromatic compound (A) with naphthaldehyde or pyrenecarboxyaldehyde, wherein a molar ratio of the naphthaldehyde or the pyrenecarboxyaldehyde to the aromatic compound (A) is 0.6-1:1, and wherein a molar ratio of the hydroxy group-containing aromatic methylol compound (B) to the aromatic compound (A) is 0.4-0.5:1, and 8. A resist underlayer film-forming composition containing a novolac resin containing a structure (C), the structure (C) of the novolac resin including one or more structure selected from the group consisting of Formula (3-4), Formula (3-5), and Formula (3-6):

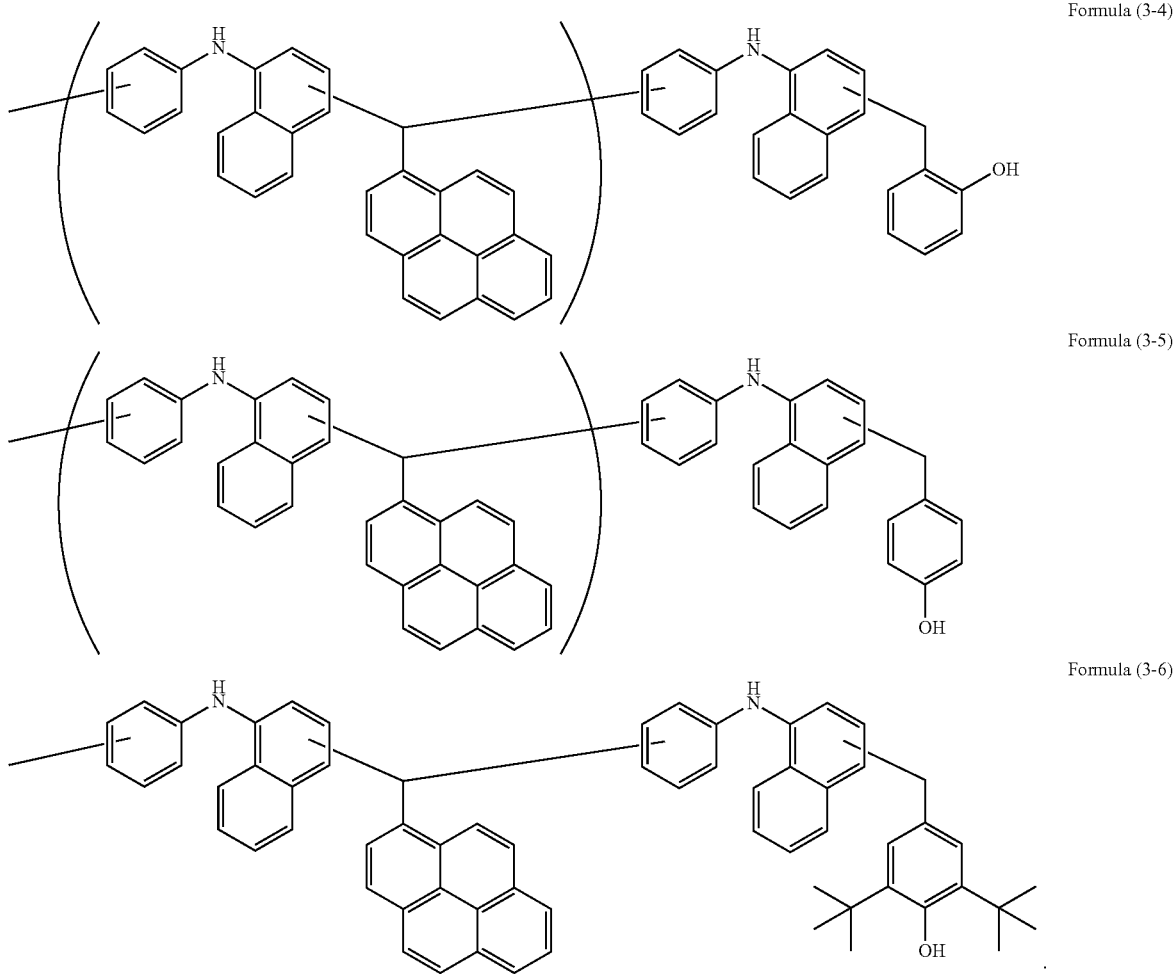

Formula (3-4)

Formula (3-5)

Formula (3-6)

wherein the condensation reaction is carried out simultaneously with the reaction of the aromatic ring of the aromatic compound (A) with the hydroxy group-containing aromatic methylol compound (B) in a one-pot reaction.

2. The resist underlayer film-forming composition according to claim 1, wherein the aromatic compound (A) is phenylnaphthylamine.

3. The resist underlayer film-forming composition according to claim 1, wherein the aromatic compound (A) is phenylindole.

4. The resist underlayer film-forming composition according to claim 1, wherein the condensation reaction of the aromatic compound (A) is with the naphthaldehyde.

5. The resist underlayer film-forming composition according to claim 1, further comprising a solvent.

6. The resist underlayer film-forming composition according to claim 1, further comprising an acid and/or an acid generator.

7. The resist underlayer film-forming composition according to claim 1, further comprising a crosslinker.

9. The resist underlayer film-forming composition according to claim 8, wherein the structure (C) is Formula (3-6).

10. The resist underlayer film-forming composition according to claim 8, wherein the structure (C) is Formula (3-4).

11. The resist underlayer film-forming composition according to claim 8, wherein the structure (C) is Formula (3-5).

12. A method for forming a resist pattern used in production of a semiconductor comprising the step of applying the resist underlayer film-forming composition according to claim 1 to a semiconductor substrate followed by firing, to form an underlayer film.

13. A method for producing a semiconductor device comprising the steps of:
   forming an underlayer film on a semiconductor substrate using the resist underlayer film-forming composition according to claim 1;
   forming a resist film on the underlayer film;
   forming a resist pattern by irradiation with light or an electron beam and development;

etching the underlayer film through the resist pattern; and processing the semiconductor substrate through the patterned underlayer film.

14. A method for producing a semiconductor device comprising the steps of:

forming an underlayer film on a semiconductor substrate using the resist underlayer film-forming composition according to claim 1;

forming a hard mask on the underlayer film;

forming a resist film on the hard mask;

forming a resist pattern by irradiation with light or an electron beam and development;

etching the hard mask through the formed resist pattern;

etching the underlayer film through the patterned hard mask; and processing the semiconductor substrate through the patterned underlayer film.

15. The method according to claim 14, wherein the hard mask is a vapor deposition film of an inorganic substance.

\* \* \* \* \*